(12) United States Patent
Hahn et al.

(10) Patent No.: US 6,544,046 B1
(45) Date of Patent: Apr. 8, 2003

(54) ELECTRICAL CONNECTOR WITH STRAIN RELIEF

(75) Inventors: Marlyn E. Hahn, York, PA (US); Stanley A. Kline, Etters, PA (US); Joseph B. Shuey, Camp Hill, PA (US)

(73) Assignee: FCI Americas Technology, Inc.

( * ) Notice: Subject to any disclaimer, the term of this patent is extended or adjusted under 35 U.S.C. 154(b) by 0 days.

(21) Appl. No.: 09/692,529

(22) Filed: Oct. 19, 2000

Related U.S. Application Data
(60) Provisional application No. 60/160,482, filed on Oct. 19, 1999.

(51) Int. Cl.$^7$ .............................................. H01R 12/00
(52) U.S. Cl. ...................................................... 439/83
(58) Field of Search ........................ 439/71, 83, 526, 439/79, 70, 571; 257/696, 697

(56) References Cited

U.S. PATENT DOCUMENTS

| | | | |
|---|---|---|---|
| 4,536,955 A | 8/1985 | Gudgeon | 29/840 |
| 4,767,344 A | 8/1988 | Noschese | 439/83 |
| 4,878,611 A | 11/1989 | LoVasco et al. | 228/180.2 |
| 5,214,308 A | 5/1993 | Nishiguchi et al. | 257/692 |
| 5,490,040 A | 2/1996 | Gaudenzi et al. | 361/773 |
| 5,637,008 A | 6/1997 | Kozel | 439/342 |
| 5,691,041 A | * 11/1997 | Frankeny et al. | 428/209 |
| 5,742,484 A | 4/1998 | Gillette et al. | 361/789 |
| 5,755,595 A | * 5/1998 | Davis et al. | 439/607 |
| 5,772,451 A | 6/1998 | Dozier, II et al. | 439/70 |
| 5,831,825 A | 11/1998 | Fromont | 361/719 |
| 5,874,776 A | 2/1999 | Kresge et al. | 257/747 |
| 5,876,219 A | 3/1999 | Taylor et al. | 439/74 |
| 5,883,782 A | 3/1999 | Thurston et al. | 364/704 |

(List continued on next page.)

FOREIGN PATENT DOCUMENTS

| | | |
|---|---|---|
| JP | 08125379 | 5/1996 |
| WO | PCT/CH97/00184 | 5/1997 |
| WO | PCT/US97/08783 | 5/1997 |
| WO | PCT/US97/18066 | 10/1997 |
| WO | PCT/US97/18354 | 10/1997 |
| WO | WO97/43885 | 11/1997 |
| WO | WO97/44859 | 11/1997 |
| WO | WO98/15989 | 4/1998 |
| WO | WO98/15991 | 4/1998 |

OTHER PUBLICATIONS

U.S. patent application Ser. No. 60/160,482, filed Oct. 19, 1999, (BERG–2546/C2581P).

U.S. patent application Ser. No. 09/302,027, filed Apr. 29, 1999, (BERG–2461/C2356).

*Primary Examiner*—Gary Paumen
*Assistant Examiner*—Ann McCamey
(74) *Attorney, Agent, or Firm*—Woodcock Washburn LLP

(57) ABSTRACT

An electrical connector mountable to a substrate. The electrical connector comprises a housing, and a surface mount contact and hold down both secured to the housing. The hold down may be a surface mount hold down. A ball grid array connector comprising a housing, a plurality of contacts secured to the housing, a plurality of fusible elements secured to the contacts for mounting the connector to a substrate, and a hold down secured to the housing. The hold down may be a surface mount hold down. A method of mounting an electrical connector to a substrate. The method comprises providing a substrate and an electrical connector having a contact and a hold down, and securing the contact and the hold down to the substrate. The contact may be secured to a surface of the substrate. A method of securing an electrical connector to a substrate. The method comprises providing a substrate and an electrical connector having a contact and a hold down, and mounting the contact to the substrate. The method further comprises balancing the electrical connector on the substrate such that the electrical connector remains substantially parallel to the substrate during the forming of the first and second solder joints.

23 Claims, 7 Drawing Sheets

U.S. PATENT DOCUMENTS

| | | | | |
|---|---|---|---|---|
| 5,888,884 A | | 3/1999 | Wojnarowski | 438/462 |
| 5,919,050 A | | 7/1999 | Kehley et al. | 439/71 |
| 5,938,451 A | | 8/1999 | Rathburn | 439/66 |
| 5,955,888 A | | 9/1999 | Frederickson et al. | 324/761 |
| 5,978,229 A | | 11/1999 | Kim | 361/760 |
| 5,984,726 A | * | 11/1999 | Wu | 439/79 |
| 6,012,948 A | * | 1/2000 | Wu | 439/79 |
| 6,037,044 A | | 3/2000 | Giri et al. | 428/209 |
| 6,089,878 A | * | 7/2000 | Meng | 439/79 |
| 6,116,926 A | | 9/2000 | Ortega et al. | 439/108 |
| 6,152,756 A | | 11/2000 | Huang et al. | 439/342 |
| 6,174,198 B1 | * | 1/2001 | Wu et al. | 439/79 |
| 6,183,301 B1 | * | 2/2001 | Paagman | 439/79 |
| 6,196,871 B1 | | 3/2001 | Szu | 439/571 |
| 6,220,895 B1 | * | 4/2001 | Lin | 439/79 |

* cited by examiner

ELECTRICAL CONNECTOR WITH STRAIN RELIEF

CROSS-REFERENCE TO RELATED APPLICATIONS

This application claims priority under 35 U.S.C. §119(e) to U.S. Provisional Patent Applications Ser. No. 60/160,482, which was filed on Oct. 19, 1999. In addition, the subject matter disclosed herein is related to the subject matter disclosed in copending application Ser. No. 09/691,811, filed on Oct. 19, 2000. Both applications are herein incorporated by reference.

BACKGROUND OF THE INVENTION

1. Field of the Invention

The invention relates to electrical connectors. More specifically, the invention relates to electrical connectors with strain relief features.

2. Brief Description of Earlier Developments

Various types of electrical connectors rely upon surface mount technology (SMT) to secure the connector's contacts to an underlying substrate. SMT connectors provide numerous benefits over earlier connectors, such as simplified manufacturing and lower costs.

While providing such advantages, the use of SMT may raise other issues. One concern, for example, involves the ability of the solder joint between the contact and the underlying substrate to absorb forces caused by, for example, shipping, handling, mating and thermal cycling. Should one solder joint become unusable as a result of damage from any of these events, the entire connector adversely may be affected.

Ball grid array (BGA) technology is one type of SMT. Generally, an electrical connector using a BGA has a housing with a contact therein. A fusible element, typically a solder ball, secures to each contact. The solder balls serve as the primary connection between the contact and the surface of the substrate. A reflow process fuses the solder ball to the substrate. During the reflow process, a beneficial "self-centering" feature of the BGA technology occurs. Specifically, as the solder reflows, the surface tension of the solder helps to align the connector properly with the conductive pads on the underlying substrate.

As with SMT connectors, forces on the solder joint in a BGA connector also poses a concern. Because of the self-centering ability of BGA connectors, however, many of the solutions used in SMT connectors cannot be used on BGA connectors. Therefore, a need exists to develop techniques for providing strain relief to BGA connectors.

SUMMARY OF THE INVENTION

It is an object of the invention to provide an electrical connector with strain relief features.

It is a further object of the invention to provide a surface mounted electrical connector with strain relief features.

It is a further object of the invention to provide a ball grid array electrical connector with strain relief features.

It is a further object of the invention to provide strain relief features to a ball grid array electrical connector compatible with the self-centering capability of the connector.

It is a further object of the invention to provide an electrical connector made with simplified manufacturing steps.

These and other objects of the invention are achieved in one aspect of the invention by an electrical connector mountable to a substrate. The electrical connector comprises a housing, and a surface mount contact and hold down both secured to the housing. The hold down may be a surface mount hold down. The connector may further comprise a shield generally surrounding the housing, wherein the hold down is part of the shield. The surface mount contact may include a fusible element in the form of a solder ball. The surface mount contacts may form a matrix array. Also, the electrical connector may be constructed such that it remains substantially parallel when mounted to the substrate. The electrical connector may include a standoff secured to the housing, wherein the standoff is adapted to retain the housing a distance from a surface of the substrate. The standoff may be a part of the shield.

These and other objects of the invention are achieved in one aspect of the invention by a ball grid array connector comprising a housing, a plurality of contacts within the housing, a plurality of fusible elements secured to the contacts for mounting the connector to a substrate, and a hold down secured to the housing. The hold down may be a surface mount hold down. The ball grid array connector may further comprise a shield generally surrounding the housing, wherein the hold down is part of the shield. Also, the ball grid array connector may include a standoff extending from the housing and adapted to retain the housing a distance from a surface of the substrate. The standoff may be a part of the shield. The ball grid array connector may be constructed such that it remains substantially parallel when mounted to the substrate.

These and other objects of the invention are achieved in one aspect of the invention by a method of mounting an electrical connector to a substrate. The method comprises providing a substrate and an electrical connector having a contact and a hold down, and securing the contact and the hold down to the substrate. The contact may be secured to a surface of the substrate. The contact may be secured before the hold down is secured, using a soldering technique, for example, to permit the connector to self-center on the substrate. The electrical connector may include a shield that is secured to the substrate. The method may further comprise constructing the electrical connector such that it remains substantially parallel when mounted to the substrate. Also, the method may comprise balancing the electrical connector on the substrate such that the electrical connector remains substantially parallel to the substrate during they are attached. The electrical connector may be a ball grid array connector.

These and other objects of the invention are achieved in one aspect of the invention by a method of securing an electrical connector to a substrate. The method comprises providing a substrate and an electrical connector having a contact and a hold down, and mounting the contact to the substrate. The method further comprises balancing the electrical connector on the substrate such that the electrical connector remains substantially parallel to the substrate during the forming of the first and second solder joints. Such balancing may be accomplished by removing material from and/or adding material to the electrical connector. Alternatively, the balancing may be accomplished by exerting an external force on the electrical connector and/or the substrate during the forming of the first and second solder joints.

These and other objects of the invention are achieved in one aspect of the invention by an improved array connector having a plurality of fusible elements that are able to support a nominal mass without an undesired flattening of the fusible elements. The nominal mass is less than a mass of the connector. The improvement comprises a feature on the connector that prevents the undesired flattening of the fusible elements. The feature may comprise a standoff. Alternatively, the feature may comprise an area of material removed from a housing of the connector.

These and other objects of the invention are achieved in one aspect of the invention by an improved electrical connector mountable to a substrate, having an array of fusible elements, and exhibiting an unbalance relative to the fusible elements. The improvement comprises a feature on the connector that prevents the unbalance from causing an undesired skewing of the connector when mounting the connector to the substrate. The feature may comprise a standoff. Alternatively, the feature may comprise an area of material removed from a housing of the connector.

BRIEF DESCRIPTION OF THE DRAWINGS

Other uses and advantages of the invention will become apparent to those skilled in the art upon reference to the specification and the drawings, in which.

DETAILED DESCRIPTION OF THE PREFERRED EMBODIMENTS

Each of the alternative embodiments described herein relates to surface mounted electrical connectors having strain relief features. Preferably, fusible elements, such as solder balls, secure the contacts to conductive elements on the substrate using ball grid array (BGA) technology. Because during reflow BGA connectors tend to precisely align relative to the conductive pads on the substrate (known as "self-centering"), the strain relief features discussed herein preferably do not interfere with this desirable characteristic. Each alternative embodiment will now be described in more detail.

Figure 1:
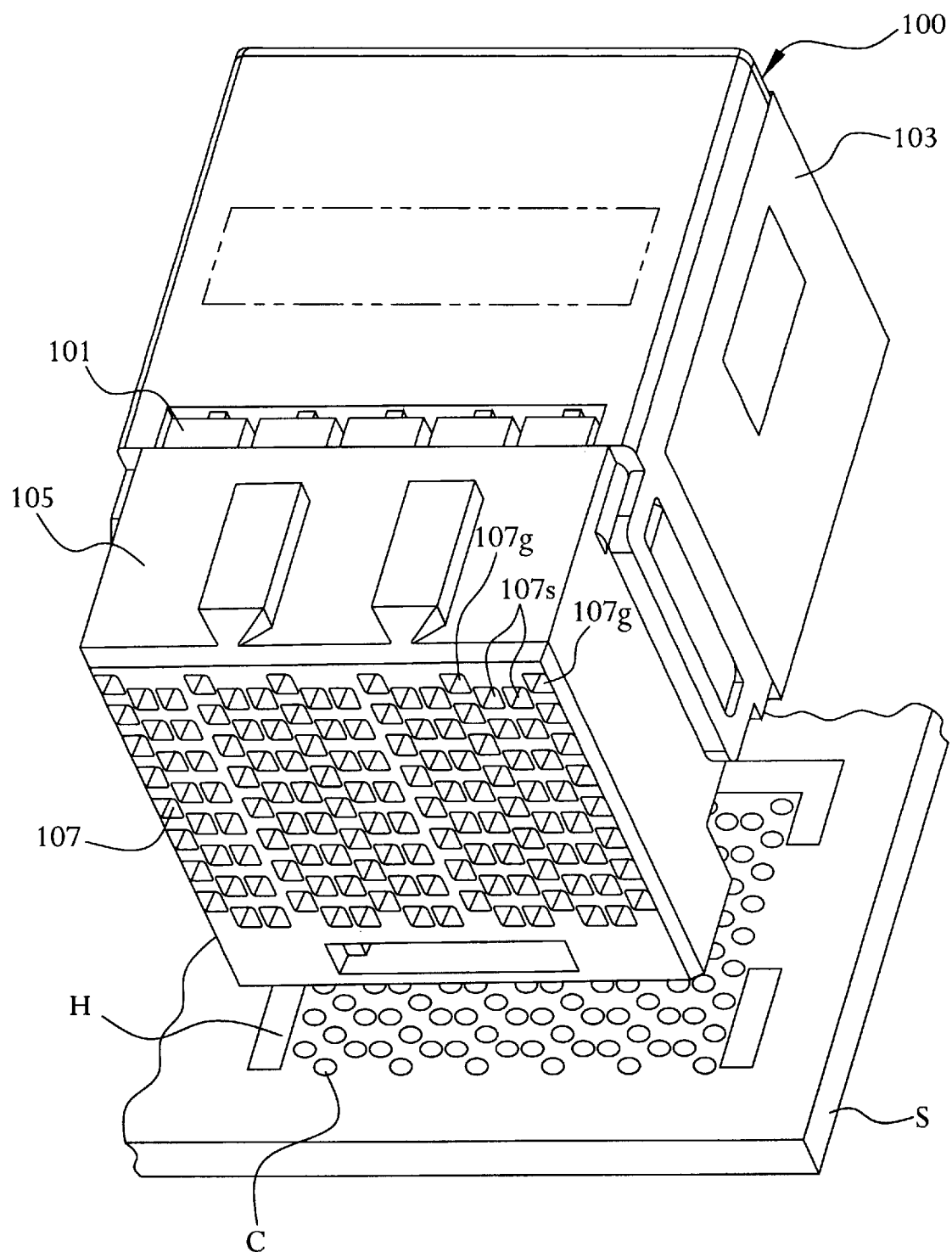
FIG. 1 is a top perspective view of a first alternative embodiment of the invention.
Figure 2A:
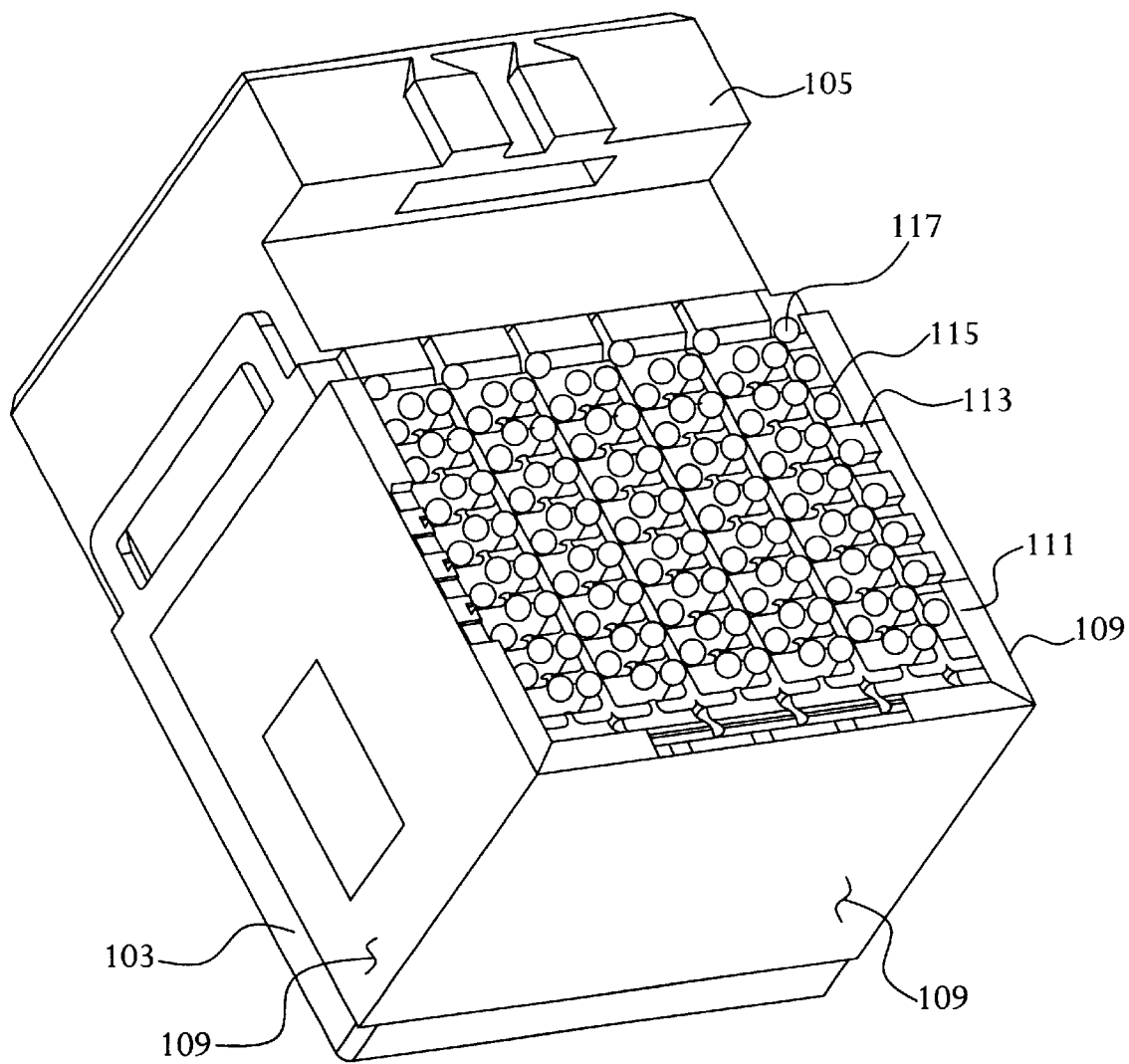
FIG. 2A is a bottom perspective view of the electrical connector in FIG. 1.
Figure 2B:
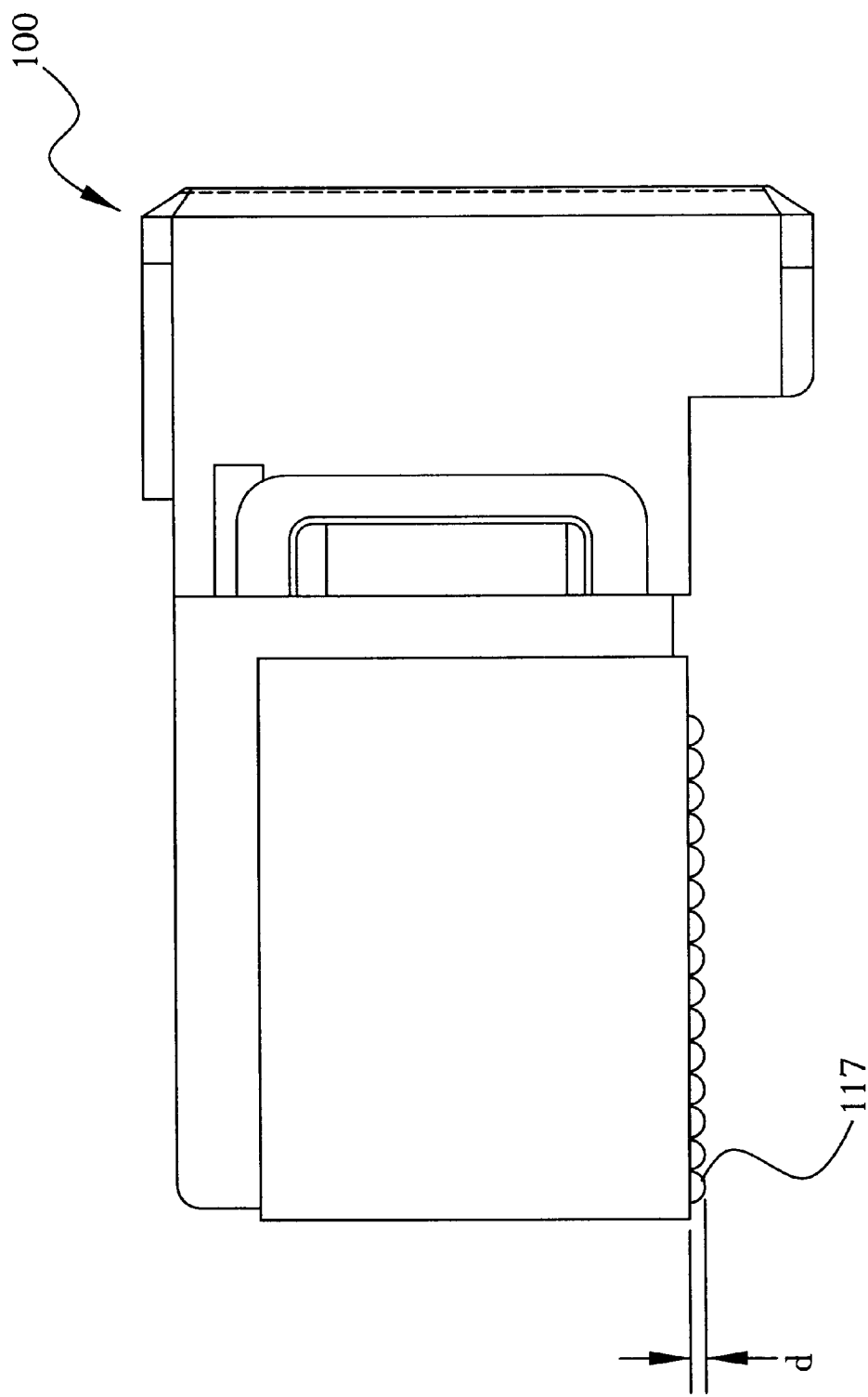
FIG. 2B is a side view of the electrical connector in FIG. 1.

FIGS. 1, 2A and 2B display electrical connector 100. Receptacle backplane connector 100 uses many of the features described in U.S. Pat. No. 6,116,926, herein incorporated by reference. Because a detailed discussion of the interior features of connector 100 are unnecessary for an understanding of the invention, only a brief summary of the interior features follows.

Figure 3:
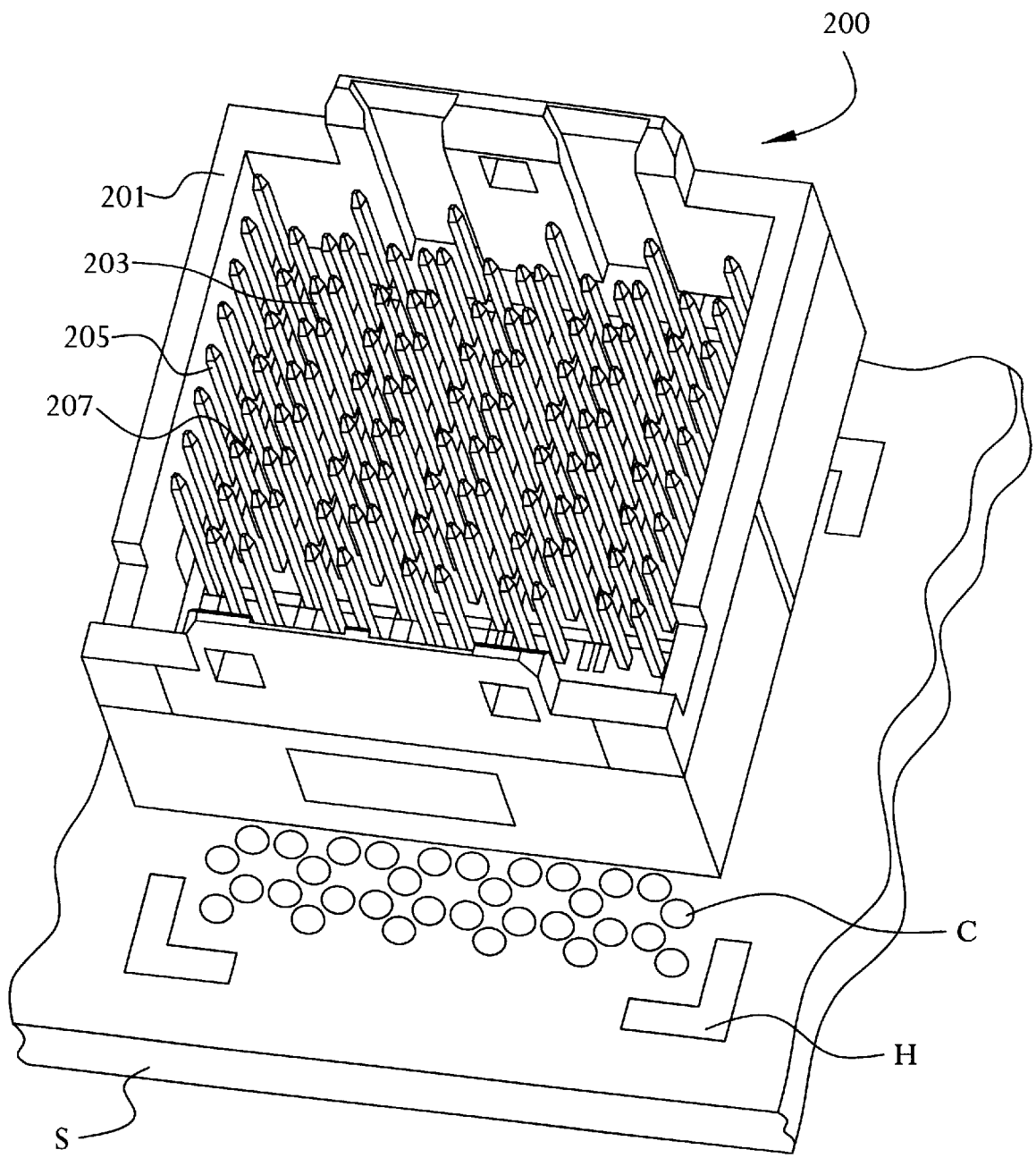
FIG. 3 is a top perspective view of a second alternative embodiment of the invention.
Figure 4A:
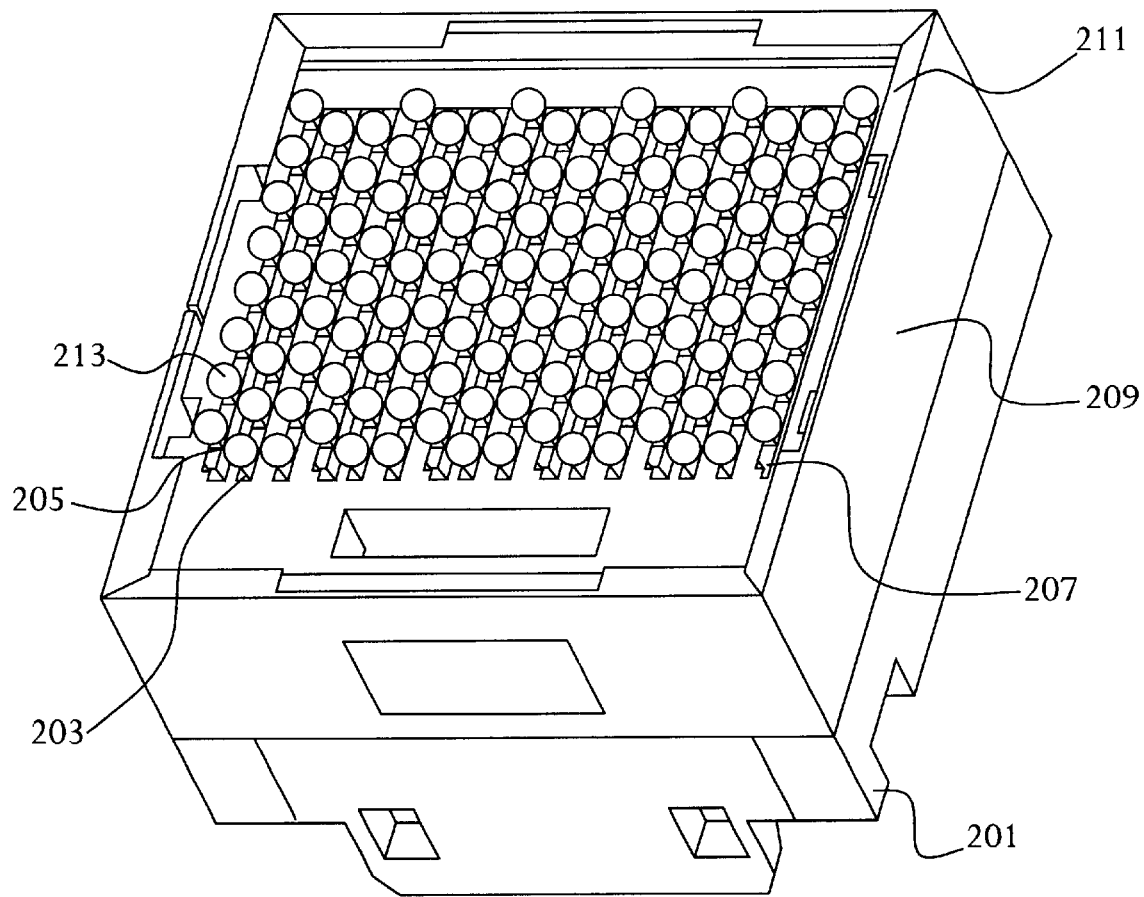
FIG. 4A is a bottom perspective view of the electrical connector in FIG. 3.
Figure 4B:
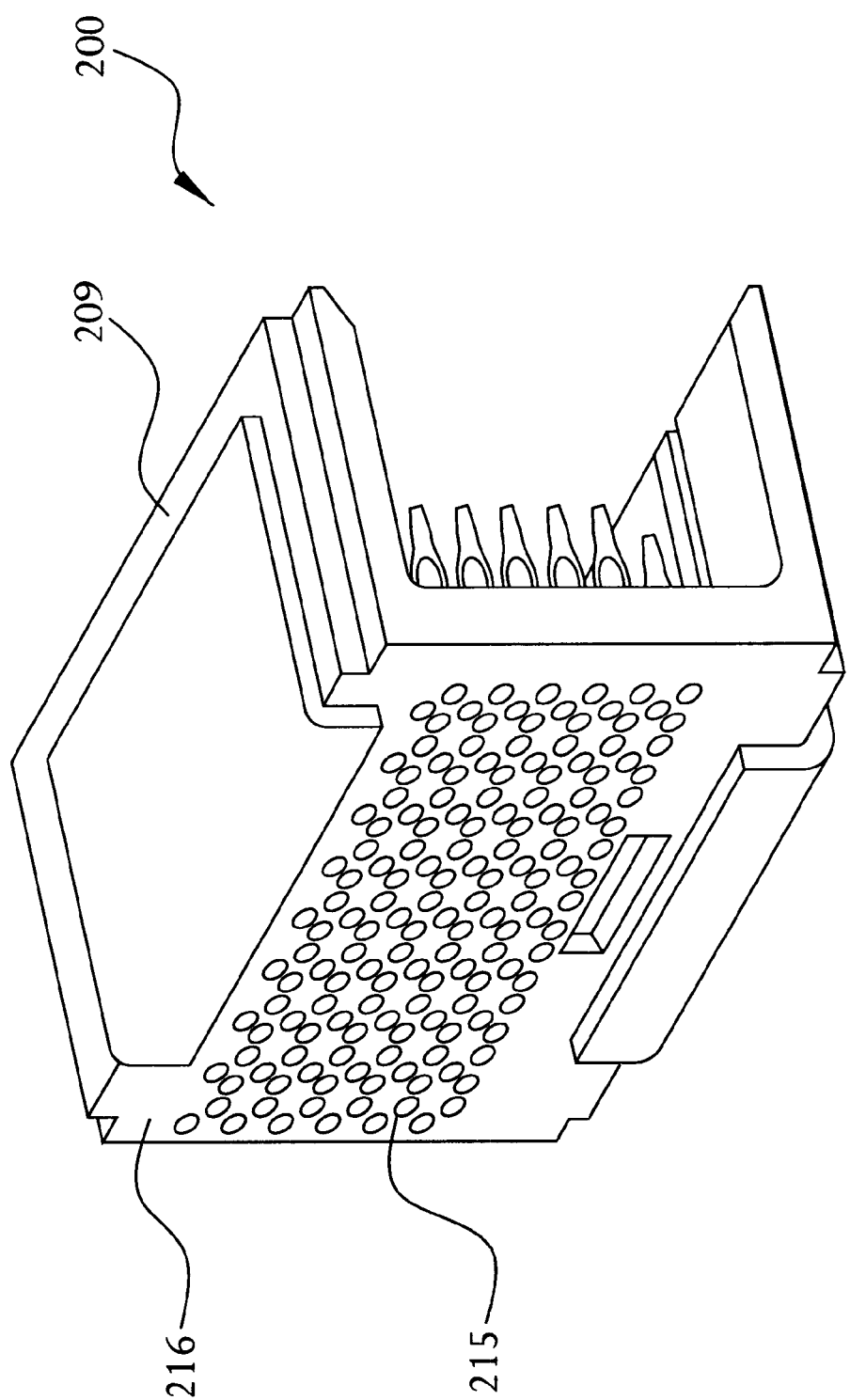
FIG. 4B is a bottom perspective view of the electrical connector in FIG. 3 with an alternative housing embodiment.

Connector 100 is modular, formed by a series of sub-assemblies 101. Rear insulative housing 103 and front insulative housing 105 can latch together and surround sub-assemblies 101 to form connector 100. Front housing 105 includes lead-in openings 107 that accept conductive pins from a mating connector (as shown in FIGS. 3, 4A and 4B). Openings 107 form a differential pair arrangement, with two rows of openings 107s that receive signal pins flanked by a row of openings 107g that receive ground pins.

An external shield 109 can surround at least rear housing 103. Shield 109 is preferably made from a suitable solderable material such as a copper alloy. Shield 109 preferably extends along at least three sides of connector 100, the rear wall and the two side walls. For retention on connector 100, shield 109 also includes bent tabs 111 that extend along portions of the bottom wall of connector 100 (i.e., the wall that faces substrate S).

Sub-assemblies 101 contain the ground contacts 113 and signal contacts 115 of connector 100. Ground and signal contacts 113, 115 mate with corresponding ground and signal pins of the mating connector. Differently than shown in U.S. Pat. No. 6,116,926, the signal and ground contacts of connector 100 surface mount to a substrate S, typically a multi-layer circuit board (MLB).

The preferred method of surface mounting connector 100 utilizes BGA technology. International Publication number WO 98/15991 (International Patent Application number PCT/US97/18354), herein incorporated by reference, describes various connectors and methods of making connectors using BGA technology.

Fusible elements 117 secure to a distal region of contacts 113, 115. Preferably, fusible elements 117 are solder balls fused to contacts 113, 115 during a reflow process. Contacts 113, 115 can have a tab at a distal end region to which solder balls 117 fuse. However, any other manner of securing flusible elements 117 to contacts 113, 115 could be used, such as placing the distal ends of contacts 113, 115 within a pocket (in FIG. 4B) of the connector housing.

As shown in FIG. 1, substrate S has an array of conductive pads C connected to suitable traces (not shown) to transmit signals or for grounding purposes, for example. Pads C correspond to the array of fusible elements 117 secured to contacts 113, 115 on connector 100.

A reflow process, typically subsequent to the reflow process that fused solder balls 117 to contacts 113, 115, fuses solder balls 117 to pads C. Typically, pads C have solder paste (not shown) thereon to accept and to temporarily secure solder balls 117 to substrate S. Typically a squeegee drawn across a stencil (not shown) placed on substrate S provides suitable amounts of solder paste at desired locations. The reflow process fuses solder ball 117 to pad C on substrate S, thus creating an electrical path between contacts 113, 115 and substrate S.

Due to the mechanical loading requirements and the durability of these types of connectors, backplane connectors such as right angle connector 100 may require strain relief features to protect the solder joints formed by solder balls 117. Accordingly, substrate S includes additional conductive pads H at suitable locations, such as surrounding conductive pads C. Conductive pads H preferably match the locations of tabs 111 of external shield 109. In this way, tabs 111 act as hold downs to secure housing 109 to the surface of substrate S.

The reflow process used to secure solder balls 117 to substrate S preferably also secures conductive shield 109 to substrate S. As with conductive pads C, conductive pads H receive solder paste during the squeegee operation. The reflow process fuses shield 109 to substrate S.

Securing conductive shield 109 to substrate S serves as the strain relief for connector 100. Because shield 109 surface mounts to substrate S, the strain relief feature of connector 100 does not interfere with the self-centering characteristic of fusible elements 117 during reflow.

The invention may protect the solder balls from being flattened during reflow because of the weight of the connector. Such flattening may cause unwanted bridging between adjacent solder balls. This may be accomplished through a number of techniques. For example, the connector may include a standoff. The standoff limits the ability of the connector to approach the substrate when the solder balls liquefy. In other words, the standoff prevents the solder balls from being flattened by the weight of the connector and from possibly bridging with adjacent solder balls. The standoffs may be made from any suitable material. Alternatively, as shown in FIG. 2B, shield 109 acts as the standoff. Shield 109 allows only a portion of solder balls 117 to extend a distance d beyond shield 109. Distance d is selected so as to limit the flattening of solder balls during the reflow process. As an example, the stand-off could allow up to 40 percent, preferably 30 percent, flattening of the solder balls. Distance d also is selected to limit the bridging of adjacent solder balls during the reflow process. In this way, shield 209 acts like a standoff by preventing connector 100 from skewing on the PCB during reflow.

FIGS. 3, 4A and 4B display electrical connector 200. Backplane header connector 200 preferably mates with backplane receptacle connector 100. Clearly, connectors 100, 200 are used in a backplane system, for example, to connect a daughtercard to a motherboard.

Connector 200 uses many of the features described in U.S. patent application Ser. No. 09/302,027, herein incorporated by reference. Because a detailed discussion of certain features of connector 200 are unnecessary for an understanding of the invention, only a brief summary of these features follows.

Connector 200 includes an insulative housing 201 with apertures therethrough that accept signal pins 203, ground pins 205 and ground shields 207. Signal and ground pins 203, 205 extend from housing 201 and correspond to the arrangement of lead-in apertures 107 in connector 100 for mating with signal and ground contacts 113, 115 (as shown in FIGS. 1, 2A and 2B). Ground shields 207 remain within housing 201, engage ground pins 205 and act to surround signal pins 203.

An external shield 209 can surround housing 201. Shield 209 preferably is made from a suitable solderable material such as a copper alloy. As shown in FIGS. 3, 4A, and 4B, shield 209 can extend along the side walls of connector 200. For retention on connector 200, shield 209 also includes bent tabs 211 that extend along portions of the bottom wall of connector 200 (i.e., the wall that faces substrate S).

As with connector 100 (as shown in FIGS. 1, 2A and 2B), connector 200 surface mounts to substrate S, preferably using the BGA technology discussed in International Publication number WO 98/15991. Fusible elements 213 secure to a distal region of contacts 203, 205. Preferably, fusible elements 213 are solder balls fused to contacts 203, 205 during a reflow process. Contacts 203, 205 can have a tab at the distal region to which solder balls 213 fuse. However, any other manner of securing fusible elements 213 to contacts 203, 205 may be used, such as a pocket 215 in the bottom surface of connector housing 201 (as shown in FIG. 4B).

As shown in FIG. 3, substrate S has an array of conductive pads C connected to suitable traces (not shown) to transmit signals or for grounding purposes, for example. Pads C correspond to the array of fusible elements 213 secured to contacts 203, 205 on connector 200.

A reflow process, typically subsequent to the reflow process that fused solder balls 213 to contacts 203, 205, fuses solder balls 213 to pads C. Typically, pads C have solder paste (not shown) thereon to accept and to temporarily secure solder balls 213 to substrate S. Typically a squeegee drawn across a stencil (not shown) placed on substrate S provides suitable amounts of solder paste at desired locations. The reflow process fuses solder ball 213 to pad C on substrate S, thus creating an electrical path between contacts 203, 205 and substrate S.

As with connector 100 (as shown in FIGS. 1, 2A and 2B), connector 200 may require strain relief features to protect the solder joints formed by solder balls 213. Accordingly, substrate S includes additional conductive pads H at suitable locations, such as surrounding conductive pads C. Conductive pads H preferably match the locations of tabs 211 of external shield 209. In this way, tabs 211 act as hold downs to secure housing 209 to the surface of substrate S.

The reflow process used to secure solder balls 213 to substrate S preferably also secures conductive shield 209 to substrate S. As with conductive pads C, conductive pads H receive solder paste during the squeegee operation. The reflow process fuses shield 209 to substrate S.

Securing conductive shield 209 to substrate S serves as the strain relief for connector 200. Because shield 209 surface mounts to substrate S, the strain relief feature of connector 200 does not interfere with the self-centering characteristic of fusible elements 213 during reflow.

FIG. 4B shows connector 200 with an alternative housing embodiment. In particular, FIG. 4B shows connector 200 with a one-piece continuous housing structure 216. In addition, housing 216 includes ball pockets 215 for receiving solder paste and solder balls 213. The pockets also receive the mounting portion of contacts 203, 205.

As previously discussed with reference to connector 100 (as shown in FIGS. 1, 2A, and 2B), the invention may protect the solder balls from being flattened during reflow because of the weight of the connector. Such flattening may cause unwanted bridging between adjacent solder balls. This may be accomplished through a number of techniques. For example, the connector may include a standoff. The standoff limits the ability of the connector to approach the substrate when the solder balls liquefy. In other words, the standoff prevents the solder balls from being flattened by the weight of the connector and from bridging with adjacent solder balls. The standoffs may be made from any other suitable material. As shown in FIG. 2B, shield 209 allows only a portion of the solder balls to extend a distance beyond shield 209. The distance is selected so as to limit the flattening of solder balls during the reflow process. The distance also is selected to limit the bridging of adjacent solder balls during the reflow process. In this way, shield 209 acts like a standoff by preventing connector 200 from skewing on the PCB during reflow.

Figure 5:
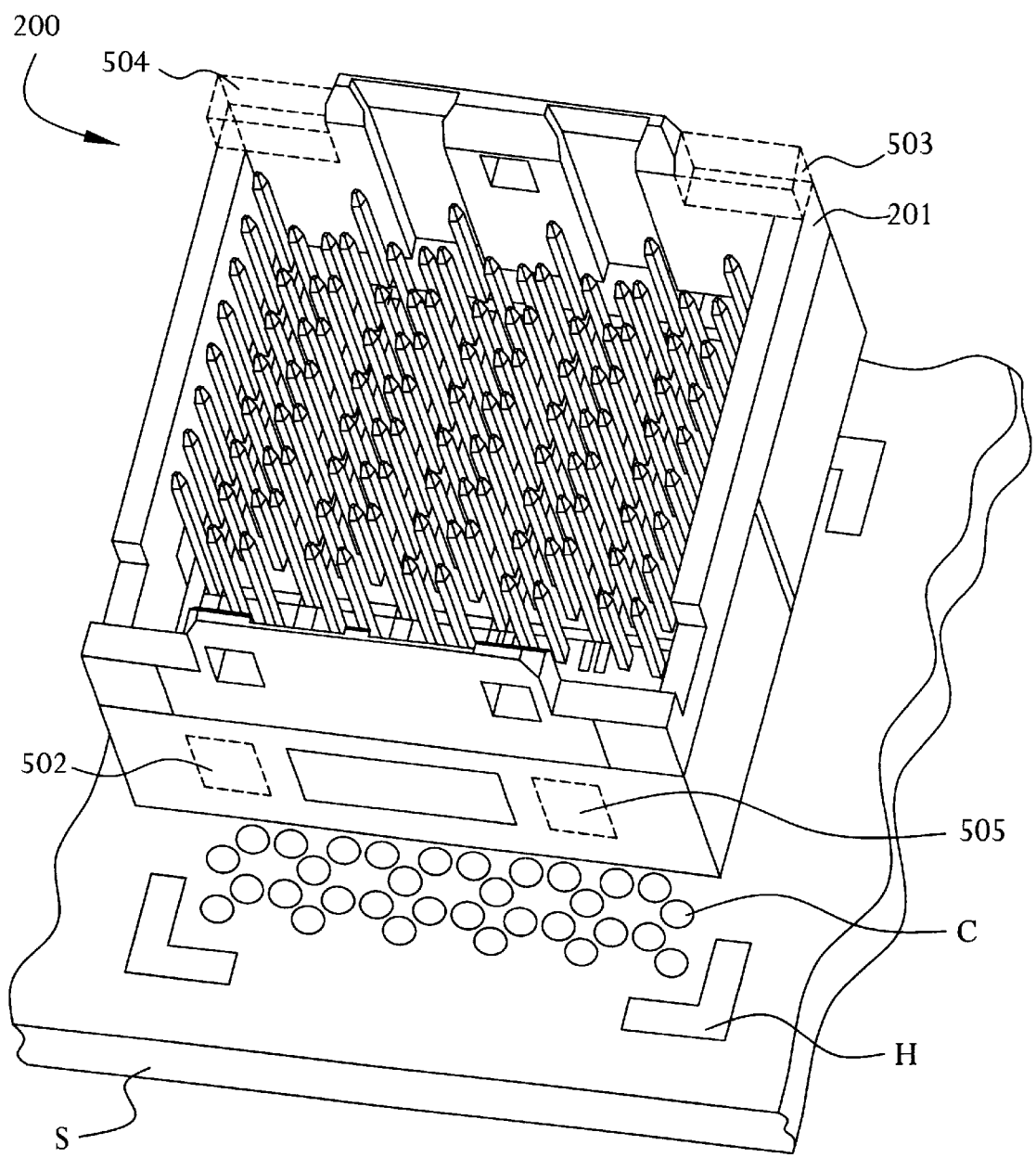
FIG. 5 is a perspective view of the electrical connector in FIG. 3 modified to ensure that the connector remains substantially parallel to the substrate during a reflow process, according to the invention.

FIG. 5 is another example of how the invention ensures that the BGA connector remains substantially parallel to the substrate during reflow. As discussed with reference to connectors 100 and 200, the BGA connector is attached to the substrate by heating the solder balls until the solder melts and becomes fused to the conductive pads on the substrate. The surface tension of the solder centers the connector on the traces of the substrate. However, in applications where the connector must be manufactured in an unbalanced state (i.e., the connector has more mass on one side of the solder then the other side), the connector may become skewed with respect to the substrate during the reflow process. As a result, certain of the solder joints may fail under a less than nominal mechanical force. Also, the skew may cause undesired bridging of adjacent solder balls. The invention ensures that the BGA connector remains substantially parallel to the substrate during reflow.

As shown in FIG. 5, portions of housing 201 on connector 200 (shown dashed for purposes of clarity) may be added and/or removed to allow the mass of connector 200 to be balanced evenly over the ball grid array. In particular, portions 502 and 505 may be removed from heavier sections of housing 201. Portions 503 and 504 may be added to lighter sections of housing 201. Although FIG. 5 shows portions 502–505 in certain locations, it should be appreciated that the location, as well as the size and weight of portions 502–505 will vary depending upon the physical characteristics of connector 200.

Although FIG. 5 illustrates balancing connector 200 on the substrate by modifying the physical characteristics of the connector, it should be appreciated that the invention is not so limited. The invention may accomplish such balancing using a number of techniques. For example, an external force may be applied to certain areas of connector 200 during the reflow process. The magnitude of such a force would be determined so as to overcome the skewed relation of connector 200 and substrate S, caused by the imbalance of the housing over the ball grid array. In another embodiment, a similar force may be applied to substrate S, in addition to or instead of the connector. Therefore, the invention includes any technique that overcomes the inherent imbalance of the connector over its ball grid array, and allows the connector to be substantially parallel with the attached substrate after reflow. Although the balancing aspect of the invention was discussed with reference to connector 200, it should be appreciated that such balancing may be applied to any connector, including receptacle connector 100 (as shown in FIGS. 1, 2A and 2B), for example.

While the invention has been described in connection with the preferred embodiments of the various figures, it is to be understood that other similar embodiments may be used or modifications and additions may be made to the described embodiment for performing the same function of the invention without deviating therefrom. Therefore, the invention should not be limited to any single embodiment, but rather construed in breadth and scope in accordance with the recitation of the appended claims.

What is claimed is:

1. An electrical connector constructed such that it remains substantially parallel when mounted to a substrate, comprising:
    a housing;
    a plurality of surface mount contacts located on said housing and secured to said substrate during a first reflow process; and
    a plurality of surface mount hold downs located on said housing on a perimeter around said surface mount contacts and soldered to said substrate during a second reflow process subsequent said first reflow process, wherein said hold down provides strain relief between said housing and said substrate.

2. The electrical connector as recited in claim 1, wherein said hold down is a surface mount hold down.

3. The electrical connector as recited in claim 1, further comprising a shield generally surrounding said housing, wherein said hold down is part of said shield.

4. The electrical connector as recited in claim 1, wherein a plurality of said surface mount contacts form a matrix array.

5. The electrical connector of claim 1, wherein said second reflow process permits a self-centering of said surface mount contacts on said substrate during said first reflow process.

6. The electrical connector as recited in claim 1, wherein said surface mount contact includes a fusible element.

7. The electrical connector as recited in claim 4, wherein said fusible element is a solder ball.

8. The electrical connector as recited in claim 1, further comprising a standoff secured to said housing, wherein said standoff is adapted to retain said housing a distance from a surface of said substrate.

9. The electrical connector as recited in claim 8, wherein said standoff is a part of said shield.

10. A ball grid array connector, comprising:
    a housing;
    a plurality of contacts secured to said housing;
    a plurality of fusible elements secured to said contacts for mounting said connector to a substrate during a first reflow process;
    a plurality of surface mount hold downs located on said housing on a perimeter around said surface mount contacts and soldered to said substrate during a second reflow process subsequent said first reflow process, wherein said hold down provides strain relief between said housing and said substrate.

11. The ball grid array connector as recited in claim 10, wherein said hold down is a surface mount hold down.

12. The ball grid array connector as recited in claim 10, further comprising a shield generally surrounding said housing, wherein said hold down is part of said shield.

13. The ball grid array connector as recited in claim 10, wherein said fusible elements are solder balls.

14. The ball grid array connector as recited in claim 10, wherein said ball grid array connector is constructed such that it remains substantially parallel when mounted to said substrate.

15. The electrical connector of claim 10, wherein said second reflow process permits a self-centering of said fusible elements on said substrate during said first reflow process.

16. The ball grid array connector as recited in claim 10, further comprising a standoff extending from said housing and adapted to retain said housing a distance from a surface of said substrate.

17. The ball grid array connector as recited in claim 16, wherein said standoff is a part of said shield.

18. An electrical connector, mountable to a substrate and comprising:
    a housing;
    a plurality of surface mount contacts located on said housing and secured to said substrate during a first reflow process; and
    a plurality of surface mount hold downs unitary with said housing on a perimeter around said surface mount contacts and soldered to said substrate during a second reflow process subsequent said first reflow process, wherein said hold down provides strain relief between said housing and said substrate, and wherein said electrical connector is constructed such that it remains substantially parallel when mounted to said substrate.

19. The ball grid array connector of claim 18, wherein said second reflow process permits a self-centering of said surface mount contacts on said substrate during said first reflow process.

20. An electrical connector, mountable to a substrate and comprising:
- a housing;
- a plurality of surface mount contacts located on said housing and secured to said substrate during a first reflow process; and
- a shield having at a rear wall and two side walls that extend along said housing, wherein said shield has a first tab extending perpendicular to a first one of said walls, and wherein said first tab mounts to said substrate during a second reflow process subsequent said first reflow process such that said connector remains substantially parallel when mounted to said substrate, and wherein said first tab provides strain relief between said housing and said substrate.

21. The electrical connector of claim 20, wherein said second reflow process permits a self-centering of said surface mount contacts on said substrate during said first reflow process.

22. The electrical connector of claim 20, wherein said shield has a second tab extending perpendicular to a second one of said walls.

23. The electrical connector of claim 22, wherein said first tab is coplanar and perpendicular to said second tab.

* * * * *